United States Patent [19]

Throngnumchai

[11] Patent Number: 5,049,512
[45] Date of Patent: Sep. 17, 1991

[54] METHOD OF FORMING A MOS FIELD-EFFECT TRANSISTOR

[75] Inventor: Kraisorn Throngnumchai, Yokosuka, Japan

[73] Assignee: Nissan Motor Co., Ltd., Yokohama, Japan

[21] Appl. No.: 247,625

[22] Filed: Sep. 22, 1988

[30] Foreign Application Priority Data

Sep. 28, 1987 [JP] Japan .................. 62-240636

[51] Int. Cl.[5] ........................... H01L 21/335
[52] U.S. Cl. ........................ 437/29; 437/40; 437/41; 437/228; 437/233; 437/235; 357/23.4
[58] Field of Search ............ 437/29, 40, 41, 235, 437/249, 225, 228, 233, 203, 38; 357/23.4, 55

[56] References Cited

U.S. PATENT DOCUMENTS

| | | | |
|---|---|---|---|
| 4,199,772 | 4/1980 | Natori et al. | 357/55 |
| 4,343,997 | 1/1981 | Natori et al. | 357/55 |
| 4,466,176 | 8/1984 | Temple | 29/571 |
| 4,503,598 | 3/1985 | Vora et al. | 357/23.4 |
| 4,516,143 | 5/1985 | Love | 357/23.4 |
| 4,516,316 | 5/1985 | Haskell | 437/228 |
| 4,710,265 | 12/1987 | Hotta | 437/41 |
| 4,748,103 | 5/1988 | Hollinger | 437/41 |

FOREIGN PATENT DOCUMENTS

| | | | |
|---|---|---|---|
| 0008072 | 1/1978 | Japan | 357/23.4 |
| 0117691 | 9/1979 | Japan | 357/23.4 |
| 56-10971 | 2/1981 | Japan | |
| 0025456 | 2/1987 | Japan | 357/23.4 |
| 0046569 | 2/1987 | Japan | 357/23.4 |
| 0126674 | 6/1987 | Japan | 357/23.4 |
| 0186476 | 8/1988 | Japan | 357/23.4 |

OTHER PUBLICATIONS

Hu et al., "Second Breakdown of Vertical Power MOSFET's", IEEE Transactions on Electron DEvices, vol. ED-29, No. 8, Aug. 1982, pp. 1287-1293.

Primary Examiner—Brian E. Hearn
Assistant Examiner—Tom Thomas
Attorney, Agent, or Firm—Foley & Lardner

[57] ABSTRACT

A vertical MOSFET, of the standard type or the conductivity modulated type, having a very short source region is obtained by first introducing an impurity through a diffusion window to form the source region, second oxidizing the bare silicon surface in the diffusion window and third removing the oxide layer formed in the diffusion window. During the oxidation step, the impurity atoms diffuse laterally from the diffusion window without being caught by the growing oxide layer, and the length of the source region is determined by the extent of the lateral diffusion.

7 Claims, 5 Drawing Sheets (A)

(B)

(C)

(D)

(E)

(A)

(B)

(C)

(D)

(E)

(A)

(B)

(C)

(D)

(E)

METHOD OF FORMING A MOS FIELD-EFFECT TRANSISTOR

CROSS REFERENCES TO RELATED APPLICATIONS

The following U.S. Patent Applications relate to vertical MOSFETs or conductivity modulated MOSFETs. (i) Ser. No. 022,967 (now abandoned); (ii) Ser. No. 060,224 ; (iii) Ser. No. 119,453 ; (iv) Ser. No. 185,387.

BACKGROUND OF THE INVENTION

The present invention relates to MOS field-effect transistors and a process for fabricating MOS field-effect transistors. More specifically, the present invention relates to MOS field-effect transistors having fine lateral impurity diffusion profiles, and processes for achieving, fine structures.

FIG. 3 shows a conventional process (disclosed in Japanese patent provisional publication No. 56-10971, for example) for fabricating a vertical MOSFET, using double diffusion technique.

At a step (A) of FIG. 3, a high resistivity epitaxial layer 2 of a first conductivity type is formed by epitaxial growth on a low resistivity substrate 1. In this example, the first conductivity type is the n type, and a second conductivity type opposite to the first type is the p type. Thus, a semiconductor body consisting of the substrate 1 and the epitaxial layer 2 is obtained. Then, a gate oxide layer 3 is formed on the high resistivity epitaxial layer 2 by thermal oxidation. Then, a polycrystalline silicon layer 4 is formed on the gate oxide layer 3 by CVD.

At a next step (B) of FIG. 3, a predetermined area of an upper surface of the high resistivity epitaxial layer 2 is exposed by patterning the gate insulating layer 3 and the polycrystalline silicon layer 4 in a manner of self alignment by lithography.

At a step (C), a base region 5 of the second conductivity type which is the p type in this example is formed by selectively doping the epitaxial layer 2 from the upper surface through a diffusion window formed at the step (B). The doping is performed, in this example, by ion implantation and thermal diffusion. During this step, the diffusion proceeds not only downward from the upper surface of the epitaxial layer 2, but also sideways from the diffusion window. Therefore, the base region 5 extends not only vertically from the upper silicon surface, but also the base region 5 extends laterally from the diffusion window under the gate oxide layer 3 and the polycrystalline silicon layer 4.

The method of forming a gate electrode beforehand, and then forming a doped region such as the base region is known as a self alignment technique. In this technique, the gate electrode is used as a mask, so that the mask is aligned automatically, and accordingly, the accuracy in dimension is greatly improved.

At a step (D), a source region of the first conductivity type such as the n type is formed by selectively doping the base region 5 by ion implantation and thermal diffusion. The source region 6 extends into the base region 5 from the upper surface.

At a step (E), a drain electrode D is formed on the bottom surface of the semiconductor body, the gate electrode G is completed, and a topside source electrode S is formed. The source electrode S is formed over the source region 6 and the base region 5, and connected to both regions.

In this process, a peripheral portion of the base region 5 is formed underneath the gate oxide layer 3 and the polycrystalline silicon layer 4, and this peripheral portion of the base region 5 acts as a channel region of the field-effect transistor. The length of the peripheral portion of the base region 5 is determined by the distances of the lateral diffusion of the base region 5 and the source region 6, so that the length can be made very small. Thus, very short channel lengths can be attained by the double diffusion technique.

FIG. 4 shows an equivalent circuit of the vertical MOSFET fabricated by the process of FIG. 3, FIG. 5 shows the characteristic relationship between drain current and drain voltage of the MOSFET.

As shown in FIG. 4, there is formed, in the base region 6, a resistance 7, having a value rb, directly under the source region 6. Electrons diffusing in the base region 5 under the source region 6 receive this resistance until they reach the source electrode.

In FIG. 5, $Vd_{SB}$ is a secondary breakdown voltage. When the drain voltage beyond the secondary breakdown voltage is applied, the vertical MOSFET loses its ability to perform the required function because of breakdown. A relation between the second breakdown voltage $Vd_{SB}$ and the resistance 7 is disclosed in IEEE Trans. Electron Devices, Vol. ED-29, No. 8, pp. 1287-1293, Aug. 1982 "Secondary Breakdown of Vertical Power MOSFETs", Chen Ming Hu, Min Hwa Chi. In order to increase the secondary breakdown voltage, it is desirable to decrease the value rb of the resistance 7.

In the conventional fabrication process, however, it is difficult to sufficiently decrease the length of the source region 6 because the source region 6 is formed by lithography, and the length of the source region 6 is determined by the accuracy of the lithography. Therefore, the vertical MOSFET obtained by this conventional process has the resistance 7 of a high value rb because of the relatively long source region 6. As a result, the secondary breakdown voltage $Vd_{SB}$ is low, and the safe operating area of the device is narrow.

SUMMARY OF THE INVENTION

It is an object of the present invention to provide a process for fabricating MOS field-effect transistors which can sufficiently decrease the length of the source region to increase the secondary breakdown voltage of the vertical MOSFET or to improve the ability of the conductivity modulated MOSFET for preventing latchup.

It is another object of the present invention to provide a vertical MOSFET of a standard type or a conductivity modulated type which has a very short source region.

According to the present invention, a process for fabricating a MOS field-effect transistor comprises six sequential steps.

The first step preparing a semiconductor body having upper and lower surfaces, and forming, on the upper surface of the semiconductor body, a multilayer film which comprises a gate insulating layer, a polycrystalline silicon layer formed on the gate insulating layer, and an upper insulating layer formed on the polycrystalline silicon layer.

A second step is a step of removing a predetermined portion of the multilayer film, and thereby exposing a predetermined area of the upper surface of the semiconductor body to form a window in the multilayer film.

A third step is a step of selectively doping the semicondcutor body through the window of the multilayer film to form a doped region, such as a source region, extending into the semiconductor body from the upper surface.

A fourth step is a step of performing thermal oxidation. By this step, an oxide layer is formed on the upper surface of the semiconductor body within the window.

A fifth step is a step of removing the oxide layer formed in the upper surface of the semiconductor body. Preferably, this step is performed by anisotropic etching.

A sixth step is a step of forming a metal electrode, such as a source electrode, contiguous to the doped region.

During the oxidation of the fourth step, heat of the oxidation causes the impurity atoms of the doped region (i.e. the source region) to diffuse vertically and laterally. The rate of the oxidation in the lateral direction is lower than the rate of lateral diffusion of the impurity atoms. Therefore, the doped region is formed directly under the multilayer film which has been already formed before the doping of the third step. In this process, the length of the doped region (the source region) is determined by the distance of lateral diffusion of the impurity atoms, so that it is possible to reduce the length of the source region.

A MOS field-effect transistor according to the present invention comprises lower and upper layers forming a semiconductor body, a base region, a source region, a multilayer film, a metal source electrode, and a drain electrode.

The lower layer extends into the semiconductor body from a lower surface of the semiconductor body. The upper layer of a first conductivity type is formed on the lower layer and extends into the semiconductor body from an upper surface of the semiconductor body. For example, the lower layer is a substrate, and the upper layer is an epitaxial layer grown on the substrate. The base region of a second conductivity type opposite to the first conductivity type is formed in the upper layer, and extends into the upper layer from the upper surface. The source region of the first conductivity type is formed in the base region, and extends into the base region from the upper surface. The source region is formed around a depression which is formed in the upper surface of the semiconductor body, and which has a bottom surface which is entirely formed by the base region, and a side surface formed by the source region. The multilayer film is formed on the upper surface of the semiconductor body, and comprises a gate insulating layer, and a polycrystalline silicon layer formed on the gate insulating layer for serving as a gate electrode. The metal source electrode is formed in the depression, and the drain electrode is formed on the lower surface of the semiconductor body.

Preferably, the source region has a bottom surface, an outer side surface which extends from the upper surface of the semiconductor body to the bottom surface of the source region, and which is determined by a profile of lateral diffusion of an impurity from a window formed in the multilayer film, and an inner side surface which extends from the upper surface of the semiconductor body to the bottom surface of the source region and which is formed by anisotropic etching.

BRIEF DESCRIPTION OF THE DRAWINGS

In FIG. 1, each of sequential fabrication steps is shown in cross section.

DETAILED DESCRIPTION OF THE INVENTION

Figure 1:
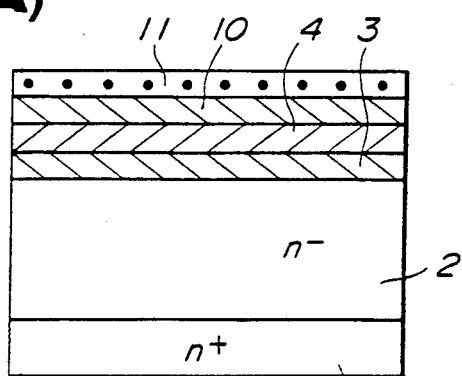
FIG. 1 is a view showing process and structure of a first embodiment of the present invention.
Figure 1:
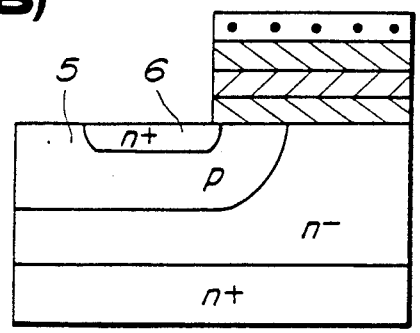
Figure 1:
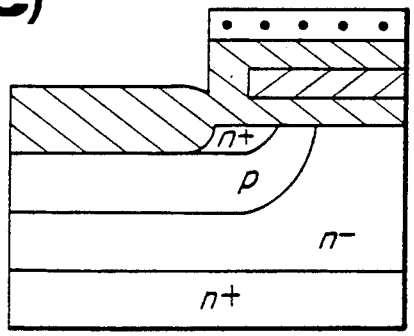
Figure 1:
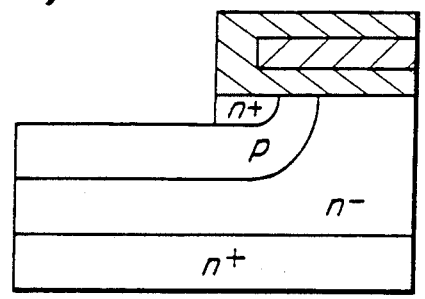
Figure 1:
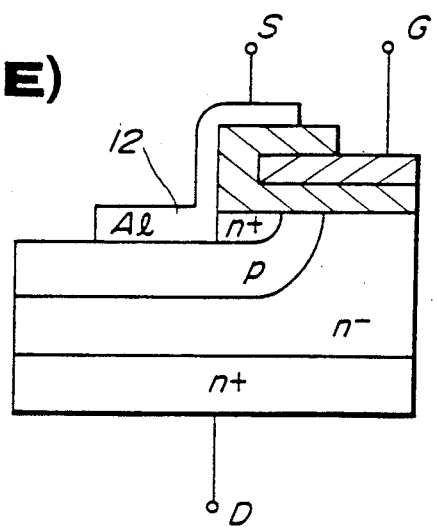

FIG. 1 shows a fabricating process according to a first embodiment of the present invention.

At a first step (A) of FIG. 1, a high resistivity epitaxial layer 2 of a first conductivity type is formed by epitaxial growth on a low resistivity substrate 1 of the first conductivity type. In this embodiment, the substrate 1 is the $n^+$ — type, and the epitaxial layer 2 is the $n^-$ -type. In the thus-formed semiconductor body, the substrate 1 extends upwardly from a lower surface of the semiconductor body, and the epitaxial layer 2 extends downwardly from an upper surface of the semiconductor body to the substrate. Then, a gate oxide layer 3, a polycrystalline silicon layer 4, an intermediate insulating layer 10 and a silicon nitride layer 11 are formed one after another by thermal oxidation, VD etc. on the high resistivity epitaxial layer 2. Thus, there is formed, on the upper surface of the semiconductor body, a multilayer film which, in this embodiment, consists of the gate oxide layer 3, the polycrystalline silicon layer 4, the intermediate insulating layer 10 and the silicon nitride layer 11.

Figure 3:
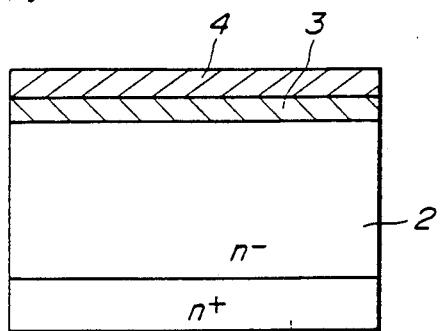
FIG. 3 is a view showing a conventional process for fabricating a vertical MOSFET.
Figure 3:
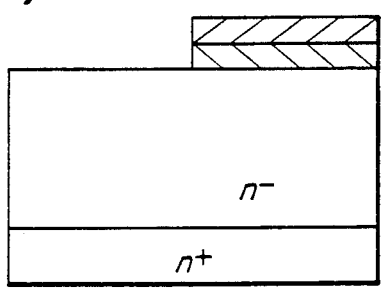
Figure 3:
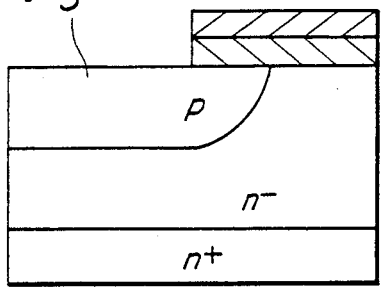
Figure 3:
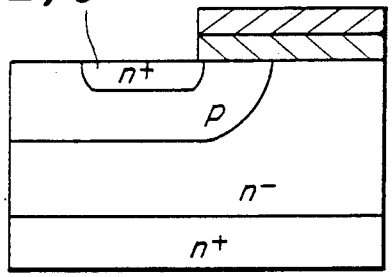
Figure 3:
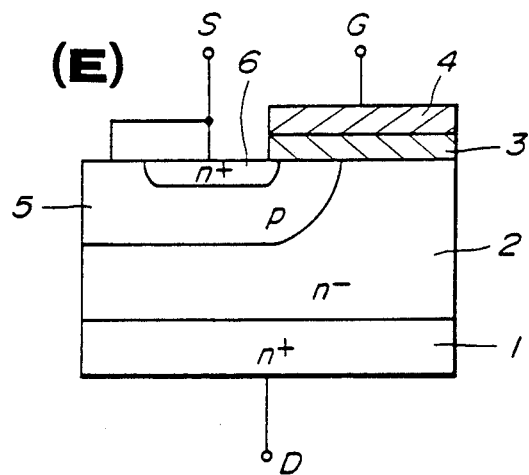

At a next step (B) of FIG. 1, a diffusion window is opened in the multilayer film by patterning the multilayer film by lithography in a self aligning manner. In the diffusion window, a bare semiconductor surface of the epitaxial layer 2 is exposed. Then, a base region 5 of the second conductivity type, and a source region 6 of the first conductivity type are formed successively by ion implantation and thermal diffusion in the same manner as the convention double diffusion shown in FIG. 3.

At a next step (C) of FIG. 1, an oxide layer is formed by thermal oxidation of the source region 6 and the base region 5. As the oxidation proceeds, impurity atoms diffuse vertically and laterally. The oxide layer grows downwardly, and the impurity atoms underneath the oxide layer are absorbed in the oxide layer. The rate of oxidation in the lateral direction is lower than the rate of lateral diffusion of the impurity atoms present in the source region 6. Therefore, the source region 6 extends laterally under the multilayer film. At the same time, the bare side surface of the polycrystalline silicon layer 4 is oxidized, and the polycrystalline silicon layer 4 is enclosed by the oxide layer.

At a step (D), the oxide layer formed by the oxidation of the source region 6 is removed by anisotropic etching, and then the silicon nitride layer 11 is removed. The inner side surface of the source region 6 is formed by the nisotro-pic etching, so that it is substantially flat. The outer side surface of the source region 6 is determined by the lateral diffusion profile.

At a step (E), a metal source electrode 12 is formed by vacuum deposition. The source electrode 12 is formed in a depression formed at the step (D) as well as on the intermediate insulating layer 10. The thus-formed source electrode 12 is contiguous to the entirety of the substantially vertical inner side surface of the source region 6. The bottom of the source electrode 12 is contiguous to the base region 5. The source region 6 is not formed underneath the bottom of the source electrode 12. At this step, the gate electrode G is completed, and a drain electrode is formed on the lower surface of the semiconductor body.

Figure 4:
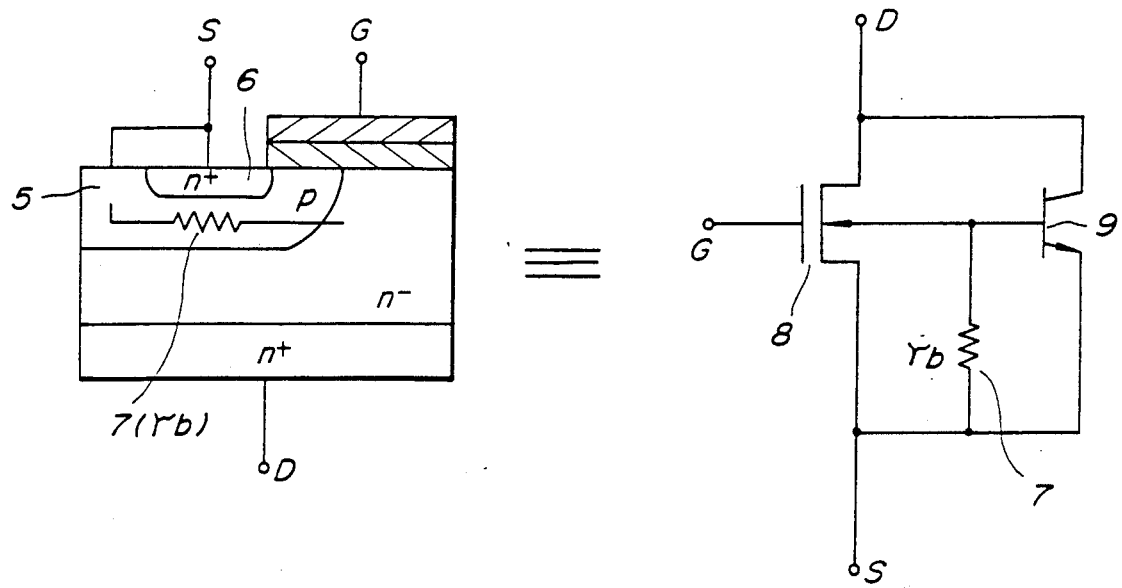
FIG. 4 shows a cross section and an equivalent circuit of the MOSFET obtained by the conventional process of FIG. 3.
Figure 5:
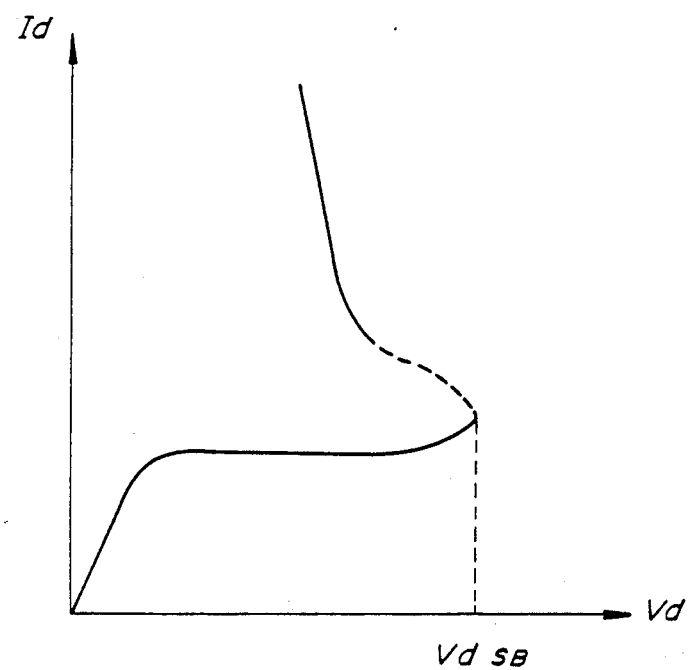
FIG. 5 is a diagram showing a relation between drain current and drain voltage of a MOSFET.

In the vertical MOSFET obtained by the fabrication sequence shown in FIG. 1, the length of the source region 6 is determined by the distance of lateral diffusion of the impurity atoms which escapes in the lateral direction from the oxide layer during the step (C). During the oxidation, the impurity atoms which diffuse in the lateral direction are not caught by the oxide layer. Therefore, the source region 6 is made very short as shown at (C) of FIG. 1. Simultaneously, the polycrystalline layer 4 is oxidized in the side surface, and insulated in a self aligning manner without need for mask alignment. Therefore, the resistance value rb of the resistance 7 formed in the base region 5, directly under the source region 6 is made very low. The structure having such a low resistance value rb can greatly decrease the problem of secondary breakdown and provide a high secondary breakdown voltage $Vd_{SB}$ by preventing turn-on of the parasitic npn bipolar transistor 9 shown in the equivalent circuit of FIG. 4. Thus, the vertical MOSFET obtained by this process can provide a high withstand voltage, and can be operated at a higher drain voltage.

Figure 2:
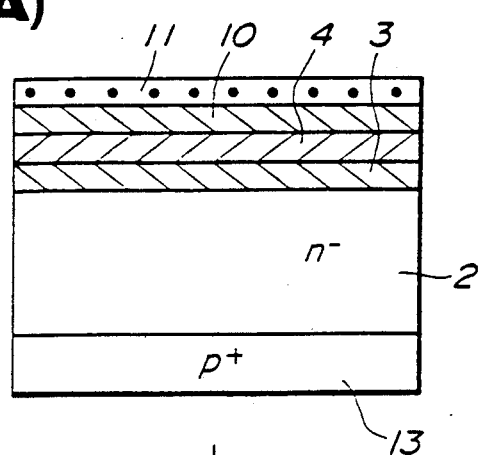
FIG. 2 is a view similar to FIG. 1, but showing a second embodiment of the present invention.
Figure 2:
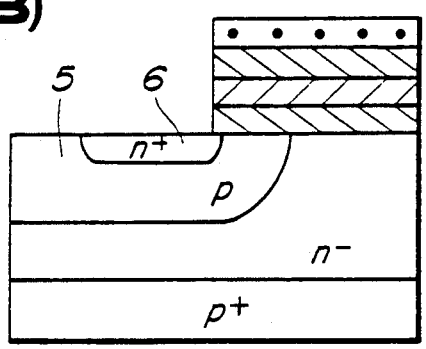
Figure 2:
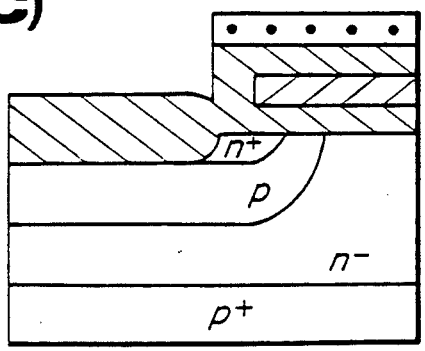
Figure 2:
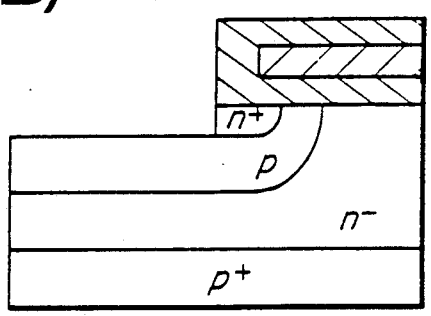
Figure 2:
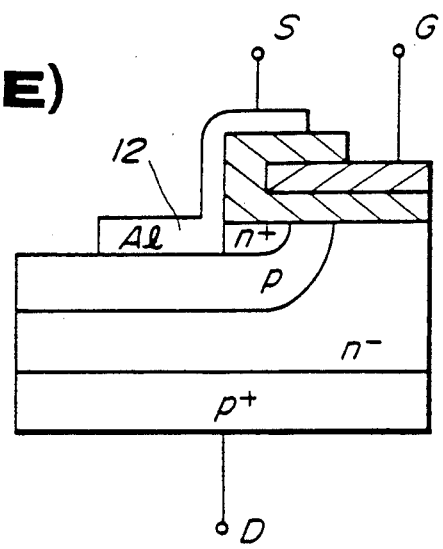

FIG. 2 shows a second embodiment of the present invention. A fabrication process shown in FIG. 2 is a process for fabricating a conductivity modulated MOSFET. The process shown in FIG. 2 is almost the same as the process of FIG. 1, and different only in that the low resistivity substrate 1 is replaced by a substrate 13 of the conductivity type opposite to the conductivity type of the epitaxial layer 2. In this embodiment, the n− epitaxial layer 2 is formed on the p+ substrate 13.

Figure 6:
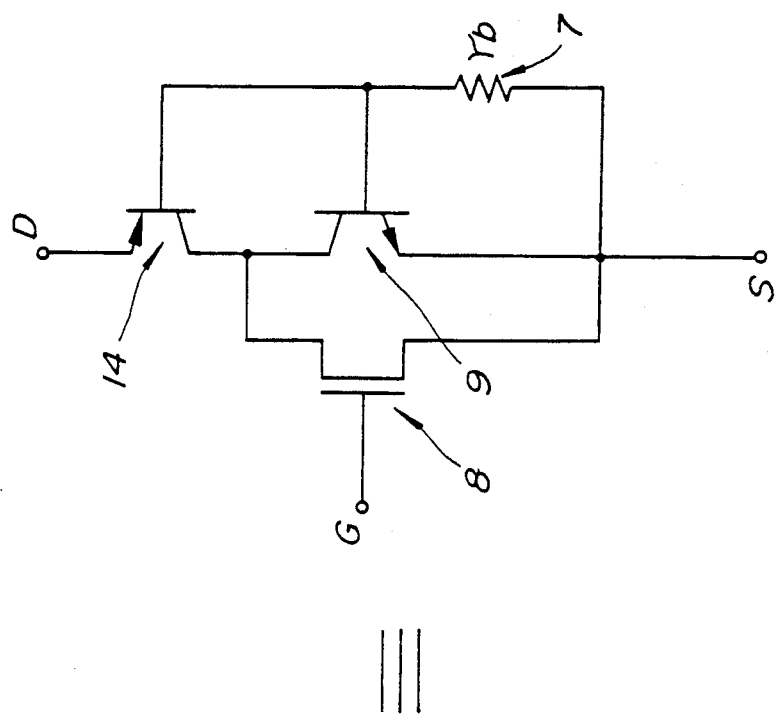
FIG. 6 shows a cross section and an equivalent circuit of a conductivity modulated MOSFET obtained by the process of FIG. 2.
Figure 6:
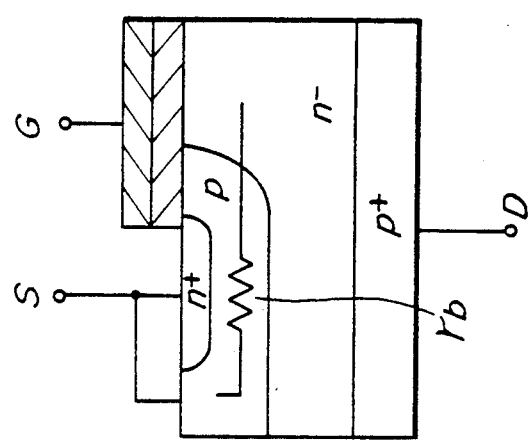

FIG. 6 shows an equivalent circuit of a conductivity modulated MOSFET. A resistance 7 shown in FIG. 6 is a resistance which electrons must receive while the electrons moves in the base region 5 under the source region 6 until the source electrode is reached. When the resistance rb is high, a parasitic npn bipolar transistor 9 is easily turned on, and accordingly, a parasitic npnp thyristor composed of the parasitic npn transistor 9 and a parasitic pnp bipolar transistor 14 easily falls into latchup. The process of FIG. 2 can reduce the resistance rb by making the length of the source region 6 very small, so that the conductivity modulated MOSFET obtained by this process can provide superior withstanding capability against latchup.

What is claimed is:

1. A process for fabricating a MOS field-effect translator, comprising:
    a first step of preparing a semiconductor body comprising a substrate and an upper layer of a first conductivity type formed on said substrate and which forms an upper surface of said semiconductor body, and forming on the upper surface of said semiconductor body a multilayer film which comprises a gate insulating layer, a polycrystalline silicon layer formed on said gate insulating layer, and an upper insulating layer;
    a second step of removing a predetermined portion of said multilayer film, thereby exposing a predetermined area of said upper surface of said semiconductor body to form a window in said multilayer film;
    a third step of doping said semiconductor body through said window to form a base region of a second conductivity type opposite to said first conductivity type, extending into said upper layer of said semiconductor body from said upper surface, and a source region of the first conductivity type extending into said base region from said upper surface;
    a fourth step of performing thermal oxidation, thereby forming an oxide layer which extends into said source region from said upper surface, and which has a bottom surface entirely bounded by said base region and a side surface bounded by said source region, a side surface of said polycrystalline silicon layer formed within said window by said second step being oxidized during said thermal oxidation, and said polycrystalline being insulated and used as a gate electrode;
    a fifth step of removing said oxide layer formed in said upper surface and forming a depression in said upper surface of said semiconductor body; and
    a sixth step of forming in said depression a metal electrode contiguous to both of said base and source regions.

2. A process according to claim 1 wherein said upper layer is an epitaxial layer grown on said substrate.

3. A process according to claim 2 wherein said fifth step is performed by anisotropic etching, said depression having a bottom surface bounded by said base region and a side surface bounded by said source region.

4. A process according to claim 3 wherein said substrate is the first conductivity type.

5. A process according to claim 3 wherein said substrate is the second conductivity type.

6. A process according to claim 1 wherein said source region is formed under said gate insulating layer around said window because of lateral diffusion of impurity atoms of said source region during said thermal oxidation of said fourth step, and said thermal oxidation is performed until said source region becomes nonexistent under said oxide layer, and remains only around said oxide layer under said gate insulating layer.

7. A process according to claim 1 wherein said third step is performed by a double diffusion technique.

* * * * *